(12) United States Patent
Gregorich et al.

(10) Patent No.: US 10,998,797 B2
(45) Date of Patent: May 4, 2021

(54) ELECTRIC MOTOR ASSEMBLY INCLUDING END CAP HAVING HEAT SINK FOR HEAT-GENERATING ELECTRICAL COMPONENT

(71) Applicant: TTI (MACAO COMMERCIAL OFFSHORE) LIMITED, Macau (MO)

(72) Inventors: Brent N. Gregorich, Easley, SC (US);
Michael Romano, Easley, SC (US);
Justin Clack, Oak Grove, LA (US);
Ronald C. McCurry, West Union, SC (US); Julia H. Moylan, Anderson, SC (US)

(73) Assignee: TTI (MACAO COMMERCIAL OFFSHORE) LIMITED, Macau (MO)

(*) Notice: Subject to any disclaimer, the term of this patent is extended or adjusted under 35 U.S.C. 154(b) by 336 days.

(21) Appl. No.: 15/846,723

(22) Filed: Dec. 19, 2017

(65) Prior Publication Data

US 2019/0190351 A1 Jun. 20, 2019

(51) Int. Cl.
| | |
|---|---|
| H02K 9/22 | (2006.01) |
| H02K 5/22 | (2006.01) |
| H05K 1/02 | (2006.01) |
| H02K 9/04 | (2006.01) |
| H02K 7/14 | (2006.01) |

(Continued)

(52) U.S. Cl.
CPC ............... *H02K 9/22* (2013.01); *H02K 5/18* (2013.01); *H02K 5/20* (2013.01); *H02K 5/225* (2013.01); *H02K 7/14* (2013.01); *H02K 9/04* (2013.01); *H02K 9/06* (2013.01); *H02K 11/0094* (2013.01); *H02K 11/33* (2016.01); *H05K 1/0203* (2013.01);

(Continued)

(58) Field of Classification Search
CPC .. H02K 9/22; H02K 9/06; H02K 9/04; H02K 11/33; H02K 11/0094; H02K 5/18; H02K 5/20; H02K 5/225; H02K 7/14; H02K 2211/08; H05K 1/0203; H05K 1/181; H05K 2201/10166
USPC ............................................. 310/60 R, 64, 62
See application file for complete search history.

(56) References Cited

U.S. PATENT DOCUMENTS

| 3,824,684 A | 7/1974 | Wheeler |
|---|---|---|
| 3,871,069 A | 3/1975 | Grieb |

(Continued)

FOREIGN PATENT DOCUMENTS

| DE | 202008015895 U1 | 2/2009 |
|---|---|---|
| DE | 102016107580 A1 | 10/2016 |

(Continued)

OTHER PUBLICATIONS

DE102016107580 English Translation.*

(Continued)

*Primary Examiner* — Maged M Almawri
(74) *Attorney, Agent, or Firm* — Michael Best & Friedrich LLP

(57) ABSTRACT

A power tool includes a housing and an electric motor assembly supported in the housing. The electric motor assembly includes a stator core and a circuit board proximate an end of the stator core. The circuit board includes a heat-generating component facing away from the stator core. The electric motor assembly also includes an end cap coupled to the stator core and in thermal contact with the heat-generating component as a heat sink to remove thermal energy from the heat-generating component.

28 Claims, 4 Drawing Sheets

(51) Int. Cl.
  *H05K 1/18* (2006.01)
  *H02K 11/33* (2016.01)
  *H02K 11/00* (2016.01)
  *H02K 9/06* (2006.01)
  *H02K 5/18* (2006.01)
  *H02K 5/20* (2006.01)

(52) U.S. Cl.
  CPC ......... *H05K 1/181* (2013.01); *H02K 2211/03* (2013.01); *H05K 2201/10166* (2013.01)

(56) References Cited

U.S. PATENT DOCUMENTS

| | | | |
|---|---|---|---|
| 3,959,677 A | 5/1976 | Grieb | |
| 5,738,177 A | 4/1998 | Schell et al. | |
| 6,320,286 B1* | 11/2001 | Ramarathnam | H02K 7/145 |
| | | | 310/47 |
| 6,552,904 B2 | 4/2003 | Fung | |
| 7,109,613 B2 | 9/2006 | Lui | |
| 8,415,842 B2 | 4/2013 | Lau | |
| 8,710,705 B2* | 4/2014 | Yamasaki | H02K 9/22 |
| | | | 310/68 D |
| 8,803,377 B2 | 8/2014 | Lau | |
| 9,124,145 B2 | 9/2015 | Lau | |
| 9,281,770 B2 | 3/2016 | Wood et al. | |
| 9,450,471 B2 | 9/2016 | Mergener et al. | |
| 9,450,476 B2* | 9/2016 | Ito | H02K 11/225 |
| 9,559,628 B2 | 1/2017 | Sergyeyenko et al. | |
| 9,577,489 B2* | 2/2017 | Collins | H02K 5/04 |
| 2003/0047304 A1* | 3/2003 | Kasuga | H02K 11/33 |
| | | | 165/185 |
| 2005/0022358 A1 | 2/2005 | Hagan et al. | |
| 2006/0261689 A1* | 11/2006 | Natsuhara | H02K 11/33 |
| | | | 310/64 |
| 2008/0150375 A1 | 6/2008 | Shima | |
| 2011/0068661 A1* | 3/2011 | Clendenen | H02K 11/33 |
| | | | 310/68 D |
| 2013/0010426 A1* | 1/2013 | Nakano | H02K 11/33 |
| | | | 361/690 |
| 2013/0313925 A1* | 11/2013 | Mergener | H02K 11/215 |
| | | | 310/50 |
| 2014/0265748 A1* | 9/2014 | Clendenen | H02K 11/33 |
| | | | 310/68 R |
| 2014/0338948 A1 | 11/2014 | Hester et al. | |
| 2014/0361645 A1 | 12/2014 | Beyerl | |
| 2015/0113815 A1* | 4/2015 | McRoberts | B23D 51/01 |
| | | | 30/392 |
| 2016/0359392 A1 | 12/2016 | Mergener et al. | |
| 2017/0085158 A1 | 3/2017 | Sergyeyenko et al. | |
| 2017/0085207 A1 | 3/2017 | Sergyeyenko et al. | |

FOREIGN PATENT DOCUMENTS

| | | |
|---|---|---|
| EP | 1157791 | 1/2007 |
| EP | 1832392 | 9/2007 |
| EP | 1681138 | 9/2008 |
| EP | 1781074 | 10/2012 |
| EP | 2875909 | 5/2015 |
| EP | 3162513 A2 | 5/2017 |
| EP | 3173170 | 5/2017 |
| WO | 2014031539 | 2/2014 |

OTHER PUBLICATIONS

DE202008015895 English Translation.*
European Patent Office Search Report for Application No. 18214068.1, dated May 3, 2019, 7 pages.

* cited by examiner

ELECTRIC MOTOR ASSEMBLY INCLUDING END CAP HAVING HEAT SINK FOR HEAT-GENERATING ELECTRICAL COMPONENT

FIELD OF THE INVENTION

The present invention relates to electric motors, in particular to providing a heat sink to the electric motor.

BACKGROUND OF THE INVENTION

Typical brushless direct current electric motors are electrically coupled to a printed circuit board, which includes field effect transistors (FETs) that power the electric motor. As the FETs power the electric motor, the FETs generate heat, which could increase the temperature of the printed circuit board or other components of the electric motor.

SUMMARY OF THE INVENTION

In one aspect, a power tool includes a housing and an electric motor assembly supported in the housing. The electric motor assembly includes a stator core and a circuit board proximate an end of the stator core. The circuit board includes a heat-generating component facing away from the stator core. The electric motor assembly also includes an end cap coupled to the stator core and in thermal contact with the heat-generating component as a heat sink to remove thermal energy from the heat-generating component.

In another aspect, an electric motor assembly includes a stator core and a circuit board proximate an end of the stator core. The circuit board includes a heat-generating component facing away from the stator cor. The electric motor assembly also includes an end cap coupled to the stator core and in thermal contact with the heat-generating component as a heat sink to remove thermal energy from the heat-generating component.

Other aspects of the disclosure will become apparent by consideration of the detailed description and accompanying drawings.

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways.

DETAILED DESCRIPTION

Figure 1:
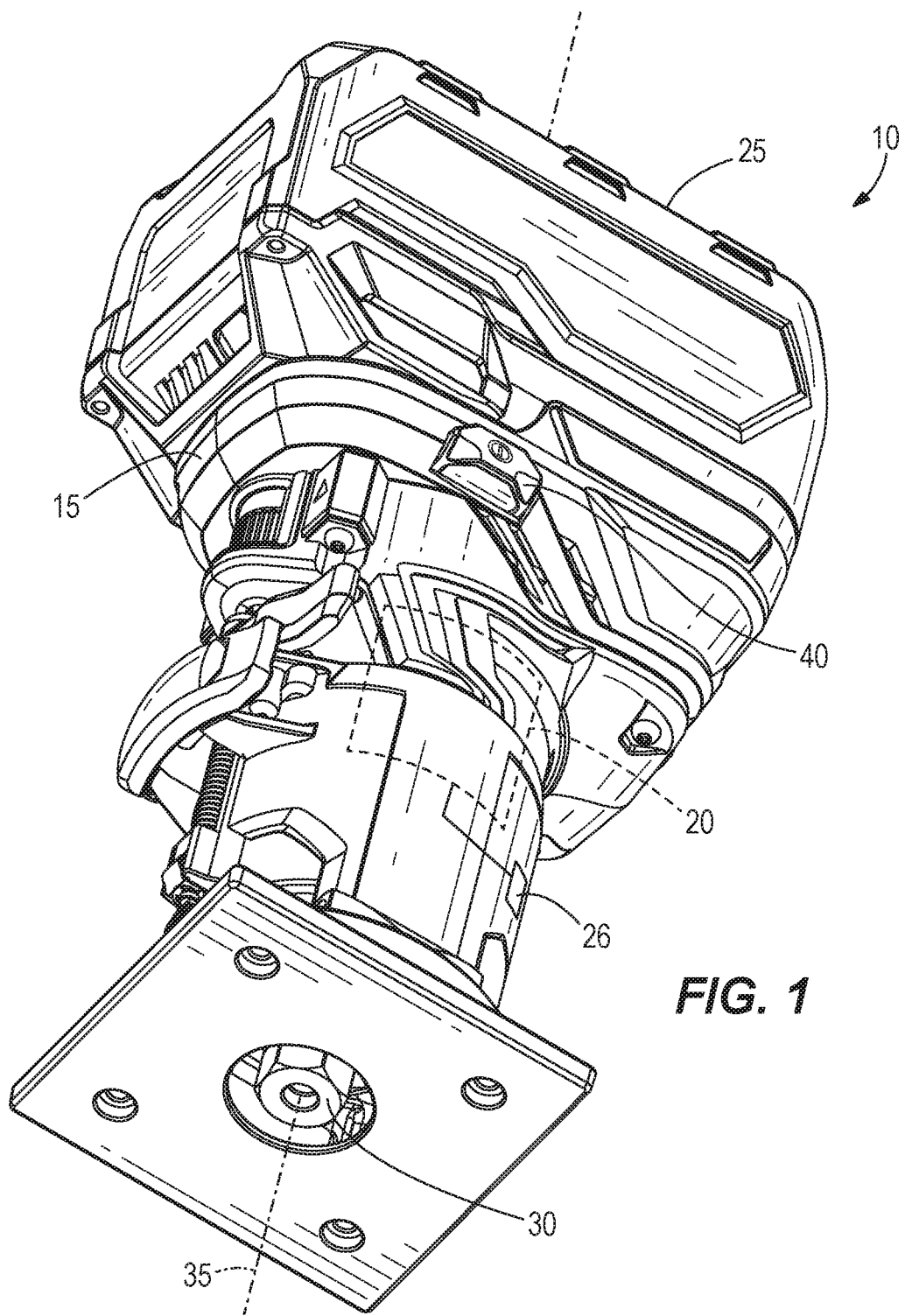
FIG. 1 is a side view of a power tool.

FIG. 1 illustrates a power tool 10 (e.g., a router operable to cut into a workpiece) that includes a housing 15 and a brushless direct current (DC) electric motor assembly 20 supported in the housing 15. The motor assembly 20 is electrically coupled to a rechargeable battery pack 25, which is selectively coupled to the housing 15. Using power from the battery pack 25, a motor controller 26 (e.g., one or more microprocessors connected to one or more printed circuit boards) operates the motor assembly 20 to drive a drive mechanism 30 about a rotational axis 35 in response to an actuator 40 (e.g., a trigger button) of the power tool 10 being depressed. The illustrated drive mechanism 30 is a chuck that selectively couples a tool bit (e.g., a twist drill bit, a router bit, etc.) to the power tool 10 for the motor assembly 20 to drive the tool bit about the rotational axis 35. In other embodiments, the power tool 10 can be a reciprocating saw, a rotary saw, a hammer drill, a grinder, a nailer, a sander, a shear, or the like with the particular power tool including an appropriate drive mechanism in order to carry out the specific function of the power tool. In addition, the illustrated battery pack 25 is a lithium-ion battery pack, but in other embodiments, the battery pack 25 can be a lead-acid, nickel-cadmium, nickel-metal hydride, etc. battery pack.

Figure 2:
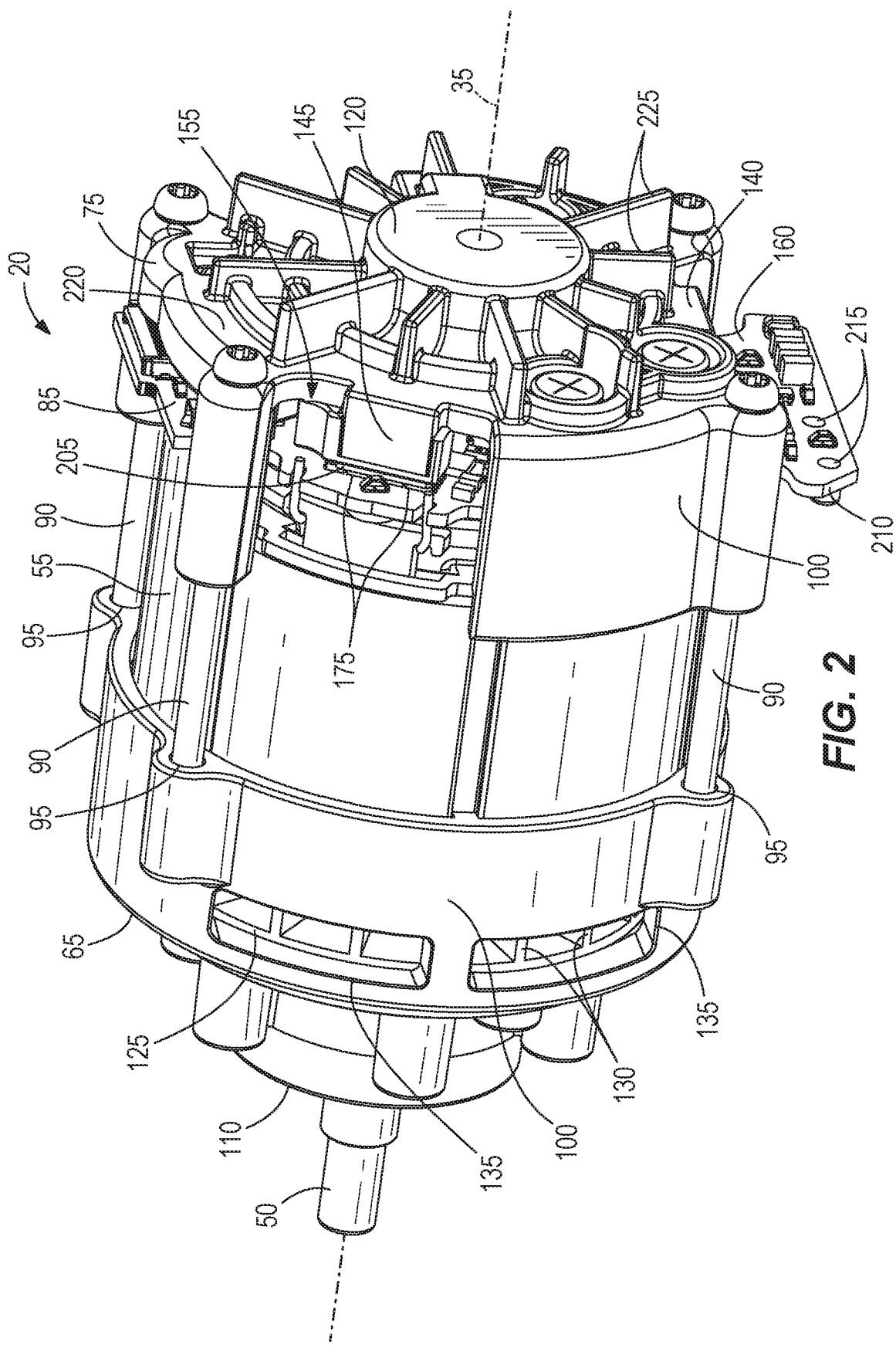
FIG. 2 is a perspective view of an electric motor assembly in accordance with an embodiment of the invention supported in the power tool of FIG. 1.
Figure 3:
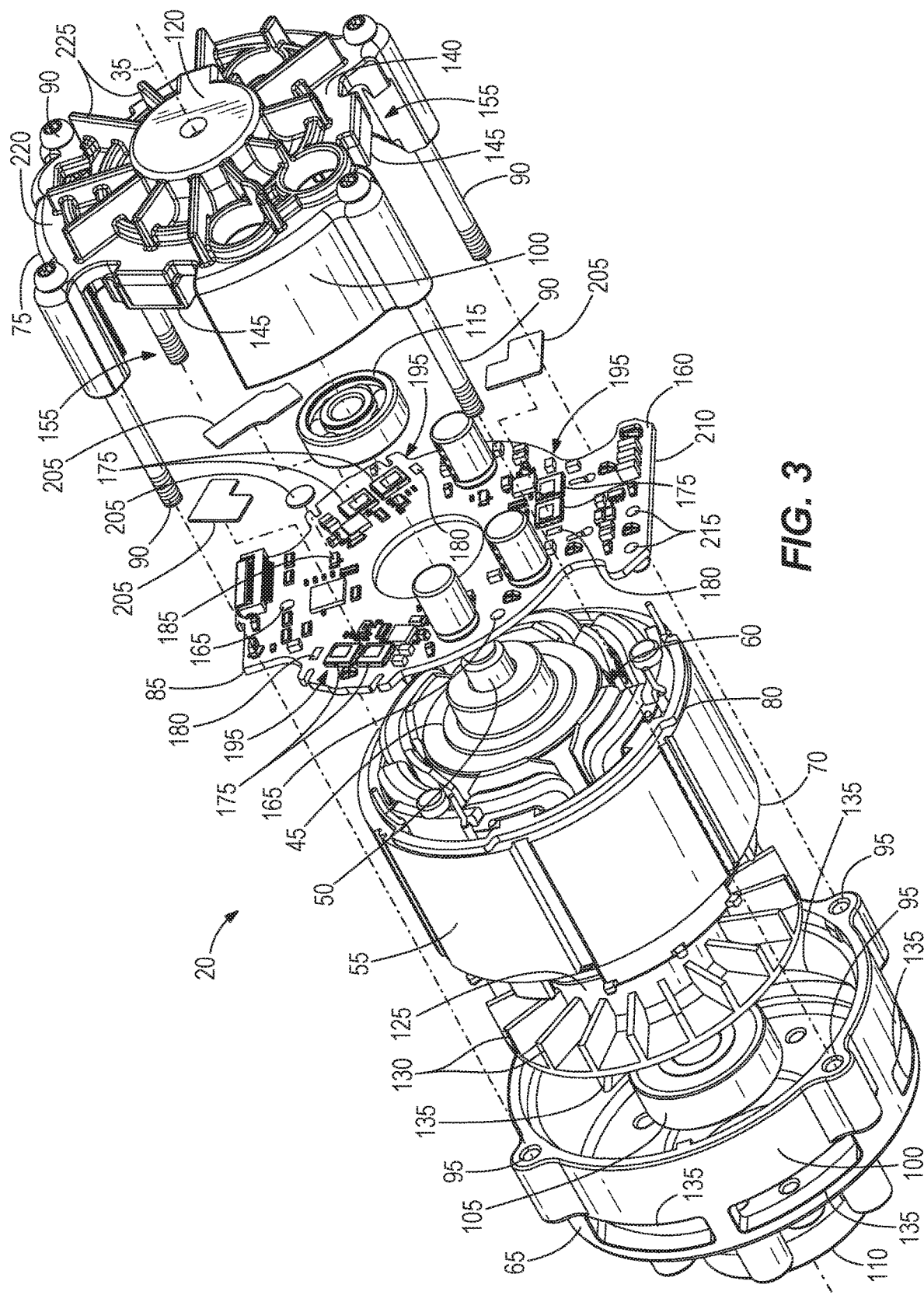
FIG. 3 is an exploded view of the electric motor assembly of FIG. 2 including a stator core, a rotor, and a printed circuit board positioned between a front end cap and a rear end cap.

With reference to FIGS. 2 and 3, the illustrated motor assembly 20 includes a rotor 45 having magnets (not shown) fixed to an output shaft 50 that is coupled to the drive mechanism 30, a stator core 55 having a central cavity 60 that receives the rotor 45 about the rotational axis 35, a front end cap 65 coupled to a front end 70 of the stator core 55, a rear end cap 75 coupled to a rear end 80 of the stator core 55, and a printed circuit board 85 (PCB) positioned between the stator core 55 and the rear end cap 75. A front portion of the output shaft 50 is rotatably supported by a first bearing 105, which is seated within a front bearing housing 110 of the front end cap 65. Likewise, a rear portion of the output shaft 50 is rotatably supported by a second bearing 115, which is seated within a rear bearing housing 120 of the rear end cap 75, so that the output shaft 50 is rotatably supported by the front and rear end caps 65, 75 about the rotational axis 35. In one embodiment, the second bearing 115 can be press fit into the rear bearing housing 120. Once the motor assembly 20 is assembled, the front end cap 65 and the rear end cap 75 are fixed to the stator core 55 by fasteners 90 extending through mounting apertures 95 formed in a circumferential sidewall 100 of each of the front and rear end caps 65, 75. Specifically, by tightening the fasteners 90, the front and rear end caps 65, 75 apply a clamping force to the stator core 55, thereby fixing the stator core 55 to the front and rear end caps 65, 75. In the illustrated embodiment, the mounting apertures 95 formed in the front end cap 65 are threaded to receive the threaded ends of the respective fasteners 90, whereby the mounting apertures 95 in the rear end cap 75 are unthreaded.

With continued reference to FIGS. 2 and 3, the motor assembly 20 also includes a fan 125 fixed to the output shaft 50 and positioned between the front end 70 of the stator core 55 and the first bearing 105. The illustrated fan 125 is at least partially received within the front end cap 65 and includes cooling blades 130 extending toward the stator core 55 that radially align with airflow apertures 135 formed through the circumferential sidewall 100 of the front end cap 65 (FIG. 2).

Figure 4:
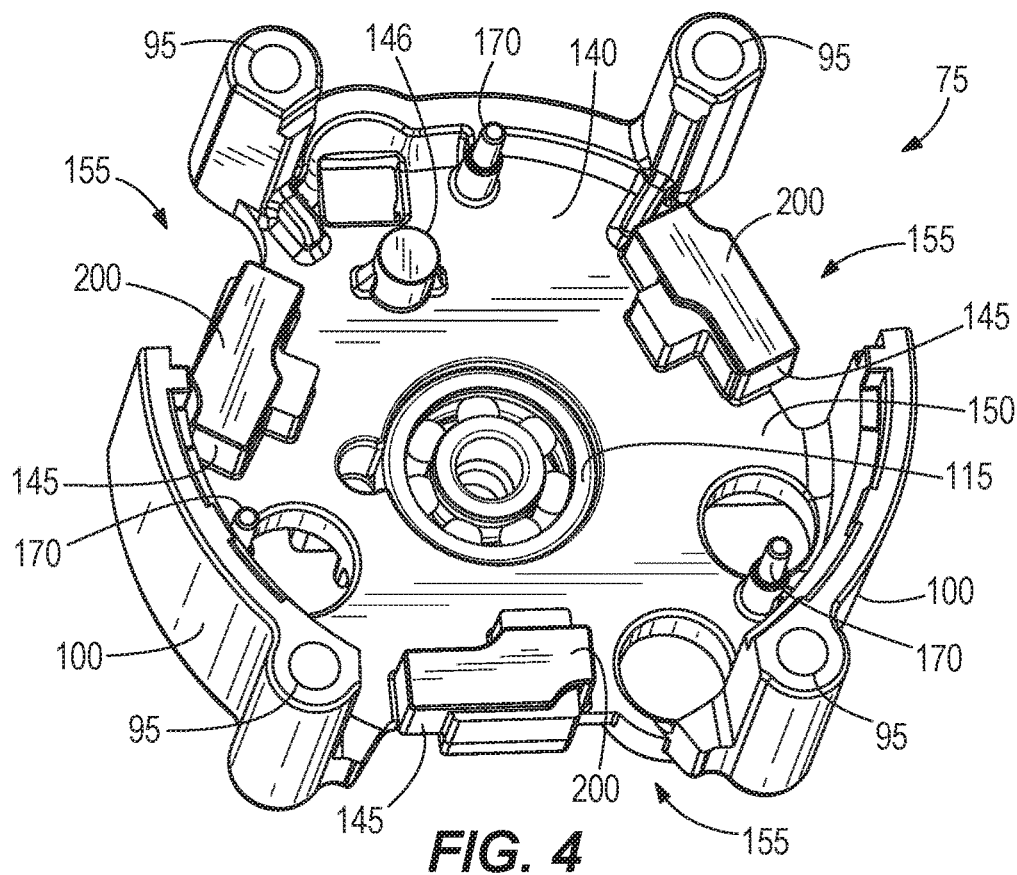
FIG. 4 is a perspective view of the rear end cap illustrating a plurality of protrusions extending from an inner surface of the rear end cap.

As best shown in FIGS. 2-4, the rear end cap 75 includes an end wall 140 from which the circumferential sidewall 100 of the rear end cap 75 extends. The rear end cap 75 also includes protrusions 145 (FIG. 4) extending from an inner surface 150 of the end wall 140 toward the PCB 85. Each protrusion 145 is positioned adjacent a radially extending aperture 155 in the rear end cap 75, with each radially extending aperture 155 at least partially defined by the circumferential sidewall 100 of the rear end cap 75. In particular, each radially extending aperture 155 is defined by a portion of the circumferential sidewall 100 as well as a portion of the end wall 140 with at least a portion of each protrusion 145 being disposed in one radially extending aperture 155. In the illustrated embodiment, the rear end cap 75 includes three protrusions 145 equally spaced 120 degrees about the rotational axis 35. In other embodiments, the rear end cap 75 can include more or fewer than three protrusions 145 that are equally spaced or non-equally spaced about the rotational axis 35.

Figure 5:
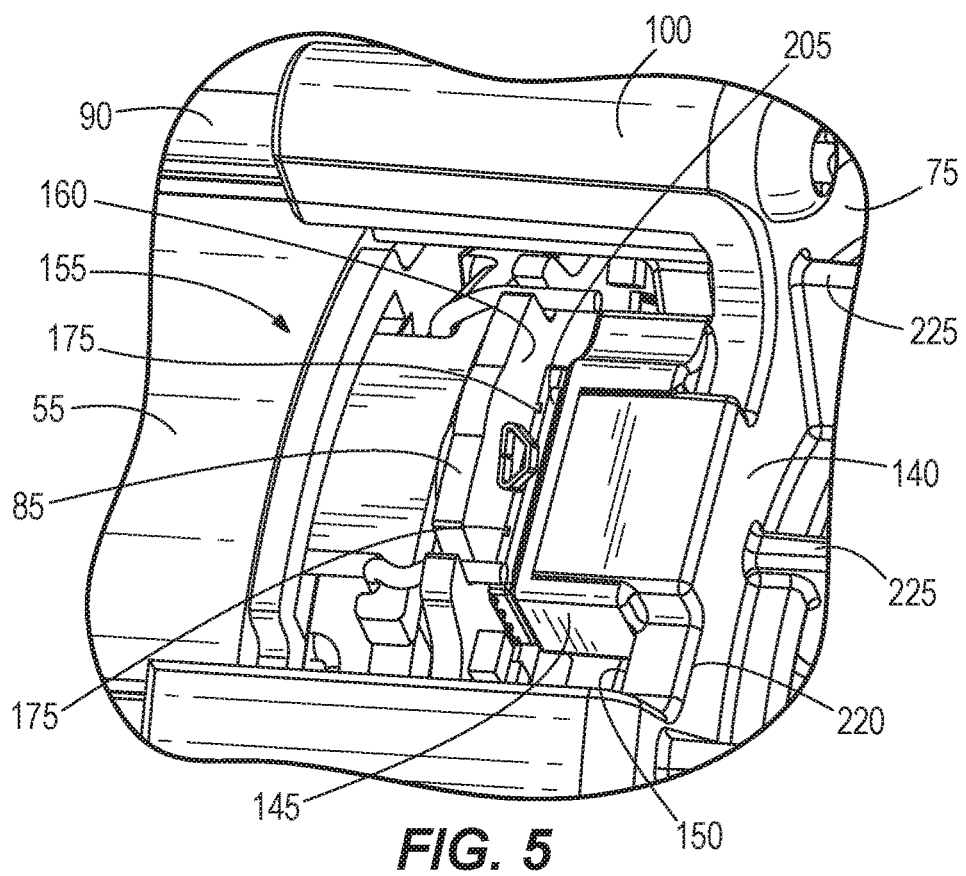
FIG. 5 is an enlarged view of the electric motor assembly of FIG. 2, illustrating one of the plurality of protrusions directly contacting a heat-generating component of the printed circuit board.

With reference to FIG. 3, the PCB 85, which is electrically coupled to the controller 26, includes a side 160 that interfaces with the rear end cap 75. In particular, the side 160 includes mounting apertures 165, each of which receives a post 170 extending from the end wall 140 of the rear end cap 75 (FIG. 4) to attach the PCB 85 to the rear end cap 75. With reference to FIG. 3, the PCB 85 includes heat-generating components (e.g., metal-oxide semiconductor FETs 175 and current sense resistors 180), a thermistor 185, and other electrical components (e.g., capacitors, diodes, voltage sensors, etc.) extending from the side 160 of the PCB 85. As such, the heat-generating components face away from the stator core 55 and toward the rear end cap 75. In the illustrated embodiment, the PCB 85 includes three pairs 195 of FETs 175 spaced about the rotational axis 35 in the same manner as the protrusions 145 of the rear end cap 75 (i.e., equally spaced 120 degrees about the rotational axis 35). As a result, the respective protrusions 145 are in thermal contact with the pairs 195 of FETs 175 when the PCB 85 is attached to the posts 170 as described above. In particular, each protrusion 145 includes an end surface 200 (FIG. 4) that is in direct contact with one side of a thermal pad 205 (e.g., a highly thermal conductive member such as copper, aluminum, etc.) and another side of the thermal pad 205 is in direct contact with a pair 195 of FETs 175 (FIG. 5) and additional heat-generating components on the PCB 85 (e.g., a current sense resistor 180). In other embodiments, the thermal pads 205 can be omitted such that the heat sink protrusions 145 directly contact the FETs 175 and the current sense resistor (s) 180. In further embodiments, the PCB 85 can include more or fewer than three pairs 195, and/or a different number of FETs 175 (and current sense resistors 180) can be associated with each pair 195. In yet further embodiments, the heat sink protrusions 145 and/or the thermal pads 205 can directly contact heat-generating components of the PCB 85 other than the FETs 175 and the current sense resistors 180. In addition, the PCB 85 includes a projection 210 that extends through one of the radially extending apertures 155 (FIG. 2). Electrical terminals 215 are positioned on the PCB projection 210, outside the rear end cap 75, for connection with electrical wires (not shown) connected at their opposite ends to the battery pack 25. In other embodiments, the PCB projection 210 can be omitted such that the electrical terminals 215 are positioned inside the rear end cap 75.

In operation, the battery pack 25 provides DC power to the various electrical components of the PCB 85 by supplying an electrical current to the electrical terminals 215. The controller 26 is configured to monitor the electrical current drawn by the motor assembly 20 using current sense resistors 180 on the PCB 85. In addition, as the electrical current travels through the PCB 85, the electrical current provides operating power to the FETs 175. In particular, by selectively activating the FETs 175, power from the battery pack 25 is selectively applied to the stator core 55 to cause rotation of the output shaft 50 about the rotational axis 35 to operate the drive mechanism 30. As the electrical current passes through the FETs 175 and the current sense resistors 180, the FETs 175 and the current sense resistors 180 generate heat (i.e., thermal energy), which if not dissipated, could otherwise decrease the performance of the motor assembly 20. The rear end cap 75 functions as a heat sink for the PCB 85 to remove thermal energy from the FETs 175 and the current sense resistors 180, and to direct the thermal energy away from the stator core 55 and the rotor 45. In particular, the thermal energy generated by the FETs 175 and the current sense resistors 180 dissipates through the thermal pads 205, the protrusions 145 and into the end wall 140, ultimately to be dissipated by convection (at least partially) through cooling fins 225 extending from an outer surface 220 of the rear end cap 75.

Moreover, as the battery pack 25 powers the motor assembly 20, the fan 125 rotates about the rotational axis 35 to induce an airflow through the motor assembly 20. In particular, as the output shaft 50 rotates, the airflow enters the motor assembly 20 through the radially extending apertures 155, travels forwardly through the central cavity 60 between the stator core 55 and the rotor 45, and exits the motor assembly 20 through the airflow apertures 135. As the airflow moves through the radially extending apertures 155, the airflow cools the heat sink protrusions 145, the thermal pads 205, the FETs 175, and the current sense resistors 180 to also dissipate thermal energy away from the motor assembly 20.

Furthermore, the thermistor 185 is in direct contact with another thermal pad 205, which is in direct contact with another protrusion 146 extending from the end wall 140 of the rear end cap 75 and is configured to send a signal to the controller 26 if the temperature of the rear end cap 75 exceeds a predetermined threshold. In one embodiment, the predetermined threshold is a maximum operating temperature of the FETs 175 so that the controller 26 can deactivate the motor assembly 20 to prevent damage when the thermistor 185 detects that the temperature of the rear end cap 75, which is approximately equal to the temperature of the FETs 175, exceeds the predetermined threshold. In other embodiments, the predetermined threshold can be lower than the maximum operating temperature of the FETs 175 (e.g., 90% of the maximum operating temperature).

Although the disclosure has been described in detail with reference to certain preferred embodiments, variations and modifications exist within the scope and spirit of one or more independent aspects of the disclosure as described. Various features and advantages of the disclosure are set forth in the following claims.

The invention claimed is:

1. A power tool comprising:
a housing; and
an electric motor assembly supported in the housing, the electric motor assembly including
   a stator core including a cavity,
   a rotor received within the cavity of the stator core, the rotor configured to rotate about a rotational axis;
   a circuit board proximate an end of the stator core, the circuit board including a first surface facing the stator core, a second surface facing opposite the first surface, and a heat-generating component positioned on the second surface, and
   an end cap coupled to the stator core to rotatably support the rotor, the end cap including an aperture, the aperture configured to allow an airflow to enter the electric motor assembly, the end cap including an inner surface, the inner surface and the second surface of the circuit board facing each other in an axial direction, the end cap including a protrusion at least partially disposed in the aperture, the protrusion extending from the inner surface of the end cap toward the second surface of the circuit board in the axial direction such that the protrusion is in thermal contact with the heat-generating component as a heat sink to remove thermal energy from the heat-generating component.

2. The power tool of claim 1, wherein the electric motor assembly further includes a fan that induces the airflow through the aperture to cool the protrusion and the Heat-generating component.

3. The power tool of claim 1, wherein a first end of the rotor is rotatably supported by the end cap, wherein the end cap is a first end cap, and wherein the electric motor assembly further includes a second end cap coupled to an end of the stator core opposite the circuit board, and wherein a second end of the rotor is rotatably supported by the second end cap.

4. The power tool of claim 3, wherein the first and second end caps are fastened together to apply a clamping force to the stator core.

5. The power tool of claim 3, wherein the electric motor assembly further includes a fan at least partially received within the second end cap.

6. The power tool of claim 1, wherein the circuit board is positioned between the end cap and the end of the stator core.

7. The power tool of claim 6, further comprising a thermal pad positioned between the protrusion and the heat-generating component, wherein the protrusion is in direct contact with the thermal pad, and wherein the thermal pad is in direct contact with the heat-generating component.

8. The power tool of claim 6, wherein the protrusion is a first protrusion and the heat-generating component is a first heat-generating component, wherein the circuit board includes a second heat-generating component facing away from the stator core, and wherein the end cap includes a second protrusion extending from the inner surface of the end cap in thermal contact with the second heat-generating component.

9. The power tool of claim 8, wherein the circuit board includes a third heat-generating component facing away from the stator core, and wherein the end cap includes a third protrusion extending from the inner surface of the end cap in thermal contact with the third heat-generating component.

10. The power tool of claim 9, wherein the first, second, and third heat-generating components are field effect transistors.

11. The power tool of claim 1, wherein the end cap includes
an end wall having the inner surface, and
a circumferential side wall at least partially defining the aperture.

12. The power tool of claim 11, wherein the end cap includes a plurality of cooling fins extending from the end wall in an opposite direction as the protrusion.

13. The power tool of claim 12, wherein the cooling fins are oriented in a radial direction relative to a central axis of the stator core.

14. The power tool of claim 11, wherein the aperture is a first radially extending aperture, and wherein the end cap includes a second radially extending aperture through which the circuit board extends.

15. The power tool of claim 14, wherein the circuit board includes an electrical terminal disposed on a portion of the circuit board extending through the second radially extending aperture in the end cap, and wherein the electrical terminal is configured to provide power to the heat-generating component.

16. The power tool of claim 15, further comprising a battery pack supported by the housing and electrically connected with the electrical terminal to selectively supply power to the heat-generating component.

17. An electric motor assembly comprising:
a stator core including a cavity;
a rotor received within the cavity of the stator core, the rotor configured to rotate about a rotational axis;
a circuit board proximate an end of the stator core, the circuit board including a first surface facing the stator core, a second surface facing opposite the first surface, and a heat-generating component positioned on the second surface; and
an end cap coupled to the stator core to rotatably support the rotor, the end cap including an aperture, the aperture configured to allow an airflow to enter the electric motor assembly, the end cap including an inner surface, the inner surface and the second surface of the circuit board facing each other in an axial direction, the end cap including a protrusion at least partially disposed in the aperture, the protrusion extending from the inner surface of the end cap toward the second surface of the circuit board in the axial direction such that the protrusion is in thermal contact with the heat-generating component as a heat sink to remove thermal energy from the heat-generating component.

18. The electric motor assembly of claim 17, wherein the electric motor assembly further includes a fan that induces the airflow through the aperture to cool the protrusion and the heat-generating component.

19. The electric motor assembly of claim 17, wherein the end cap includes
an end wall having the inner surface, and
a circumferential side wall at least partially defining the aperture.

20. The electric motor assembly of claim 19, wherein the end cap includes a plurality of cooling fins extending from the end wall in an opposite direction as the protrusion.

21. The electric motor assembly of claim 19, wherein the aperture is a first radially extending aperture, and wherein the end cap includes a second radially extending aperture through which the circuit board extends.

22. The electric motor assembly of claim 21, wherein the circuit board includes an electrical terminal disposed on a portion of the circuit board extending through the second radially extending aperture in the end cap, and wherein the electrical terminal is configured to provide power to the heat-generating component.

23. The electric motor assembly of claim 17, wherein the circuit board is positioned between the end cap and the end of the stator core.

24. The electric motor assembly of claim 23, further comprising a thermal pad positioned between the protrusion and the heat-generating component, wherein the protrusion is in direct contact with the thermal pad, and wherein the thermal pad is in direct contact with the heat-generating component.

25. The electric motor assembly of claim 23, wherein the protrusion is a first protrusion and the heat-generating component is a first heat-generating component, wherein the circuit board includes a second heat-generating component facing away from the stator core, and wherein the end cap includes a second protrusion extending from the inner surface of the end cap in thermal contact with the second heat-generating component.

26. The electric motor assembly of claim 25, wherein the circuit board includes a third heat-generating component facing away from the stator core, and wherein the end cap includes a third protrusion extending from the inner surface of the end cap in thermal contact with the third heat-generating component.

27. The electric motor assembly of claim 26, wherein the first, second, and third heat-generating components are field effect transistors.

28. The power tool of claim 17, wherein a first end of the rotor is rotatably supported by the end cap, wherein the end cap is a first end cap, and wherein the electric motor assembly further includes a second end cap coupled to an end of the stator core opposite the circuit board, and wherein a second end of the rotor is rotatably supported by the second end cap.

* * * * *